(12) United States Patent
Granada et al.

(10) Patent No.: US 7,101,734 B2
(45) Date of Patent: Sep. 5, 2006

(54) FLIP CHIP SUBSTRATE DESIGN

(75) Inventors: Honorio T. Granada, Cebu (PH);
Rajeev Joshi, Cupertino, CA (US);
Connie Tangpuz, Lapulapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 112 days.

(21) Appl. No.: 10/660,866

(22) Filed: Sep. 11, 2003

(65) Prior Publication Data

US 2005/0051878 A1 Mar. 10, 2005

Related U.S. Application Data

(62) Division of application No. 09/619,115, filed on Jul. 19, 2000, now Pat. No. 6,661,082.

(51) Int. Cl.
*H01L 21/44* (2006.01)
(52) U.S. Cl. ...................... 438/111; 438/123
(58) Field of Classification Search ........ 438/613–616, 438/111, 123
See application file for complete search history.

(56) References Cited

U.S. PATENT DOCUMENTS

| | | | |
|---|---|---|---|
| 3,972,062 A | 7/1976 | Hopp | |
| 5,629,835 A | 5/1997 | Mahulikar et al. | |
| 5,637,916 A | 6/1997 | Joshi | |
| 5,765,280 A | 6/1998 | Joshi | |
| 5,789,809 A | 8/1998 | Joshi | |
| 5,814,884 A * | 9/1998 | Davis et al. | 257/723 |
| 6,031,284 A | 2/2000 | Song | |
| 6,133,634 A | 10/2000 | Joshi | |
| 6,294,403 B1 | 9/2001 | Joshi | |
| 6,329,713 B1 | 12/2001 | Farquhar et al. | |
| 6,423,623 B1 | 7/2002 | Bencuya et al. | |
| 6,458,681 B1 * | 10/2002 | DiStefano et al. | 438/612 |
| 6,469,384 B1 | 10/2002 | Joshi | |
| 6,489,678 B1 | 12/2002 | Joshi | |
| 6,566,749 B1 | 5/2003 | Joshi et al. | |
| 6,624,522 B1 | 9/2003 | Standing et al. | |
| 6,627,991 B1 | 9/2003 | Joshi | |
| 6,633,030 B1 | 10/2003 | Joshi | |
| 6,661,082 B1 | 12/2003 | Granada et al. | |
| 6,683,375 B1 | 1/2004 | Joshi | |
| 6,696,321 B1 | 2/2004 | Joshi | |
| 6,720,642 B1 | 4/2004 | Joshi | |
| 6,731,003 B1 | 5/2004 | Joshi | |
| 6,740,541 B1 | 5/2004 | Rajeev | |
| 6,753,605 B1 | 6/2004 | Joshi | |
| 6,798,044 B1 | 9/2004 | Joshi | |
| 6,806,580 B1 | 10/2004 | Joshi | |
| 6,836,023 B1 | 12/2004 | Joshi | |

FOREIGN PATENT DOCUMENTS

WO WO 00/08684 2/2000

* cited by examiner

*Primary Examiner*—Douglas W Owens
(74) *Attorney, Agent, or Firm*—Townsend and Townsend and Crew LLP

(57) ABSTRACT

A chip device that includes a leadframe that has a die attach cavity. The memory device further includes a die that is placed within the die attach cavity. The die attach cavity is substantially the same thickness as the die. The die is positioned within the cavity and is attached therein with a standard die attachment procedure.

12 Claims, 2 Drawing Sheets

FLIP CHIP SUBSTRATE DESIGN

CROSS REFERENCE TO RELATED APPLICATIONS

This application is a divisional application of U.S. patent application Ser. No. 09/619,115, filed Jul. 19, 2000 now U.S. Pat. No. 6,661,082, which is herein incorporated by reference in its entirety for all purposes.

BACKGROUND OF THE INVENTION

1. Field of the Invention

The present invention relates to a chip device, and more particularly, to discrete power components such as MOSFETs, as well as ICs such as memory circuits that include a leadframe that includes a cavity for receiving the die.

2. Description of the Prior Art

Chip devices generally include a leadframe and a bumped die attached thereto. Many of the packages are multiple pieces and rely on wire bonding as the interconnect between the die and the package. Additionally, many BGA (ball grid array) substrates do not have the capability for solder balls to be pre-attached or for a cavity to be milled in the substrate to facilitate die attach.

These prior art packages limit the ability to form thin packages. Additionally, the manufacturing processes for these devices are inefficient.

SUMMARY OF THE INVENTION

The present invention provides a chip device that includes a die and a leadframe. The leadframe includes a die attach cavity. The die attach cavity is substantially the same thickness as the die. The die is positioned within the cavity and is attached therein with a standard die attachment procedure.

In accordance with one aspect of the present invention, a plurality of dimples is defined around the periphery of the leadframe the receives solder balls.

In accordance with another aspect of the present invention, the leadframe consists of a copper based alloy.

In accordance with a further aspect of the present invention, the leadframe includes a solderable coating.

The present invention also provides a method of making a memory device. The method includes providing a die and providing a leadframe that includes a die attach cavity. The leadframe includes a plurality of dimples defined around a periphery of the Leadframe. The die attach cavity has substantially the same thickness as the die. Solder balls are placed into the dimples. The die is flipped into the die attach cavity.

The resulting chip device has enhanced thermal performance since heat is dissipated from the face of the die (where it is generated) as well as from the bottom of the die due to its contact with the leadframe structure. The memory device also has a thinner package comparable to TSSOP stand-off, which is the current trend for miniaturization. The manufacturing process is simplified when compared to conventional assembly processes by eliminating such steps as wire bonding, molding, forming and plating.

Other features and advantages of the present invention will be understood upon reading and understanding the detailed description of the preferred exemplary embodiments, found hereinbelow in conjunction with reference to the drawings in which like numerals represent like elements.

DETAILED DESCRIPTION OF THE PREFERRED EXEMPLARY EMBODIMENTS

Figure 1:
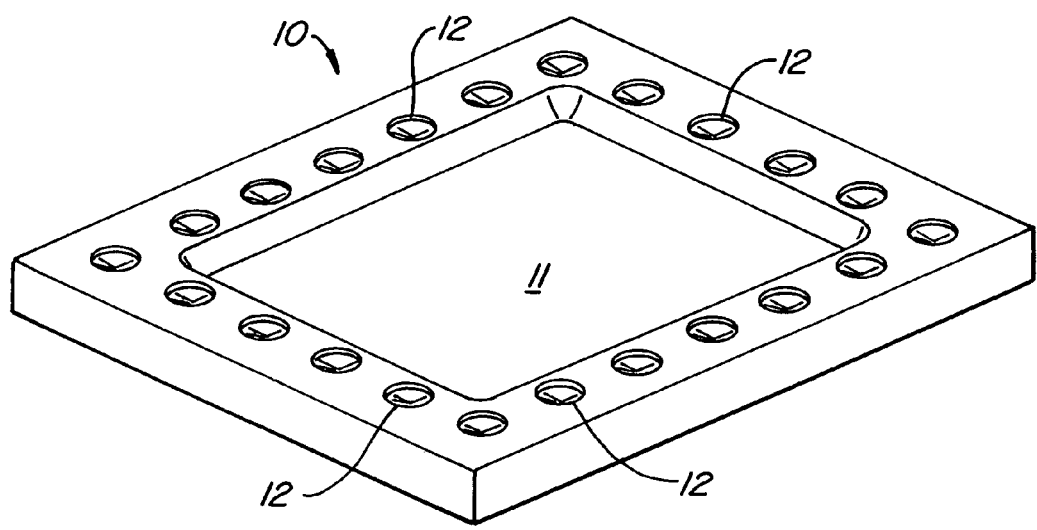
FIG. 1 is a perspective view of a flip chip leadframe in accordance with the present invention.

FIG. 1 illustrates a leadframe 10 for use in manufacturing a chip device in accordance with the present invention. The leadframe includes a die attach cavity 11 defined within the leadframe. In a preferred embodiment, a plurality of dimples 12 are defined around the periphery of the leadframe.

Figure 2:
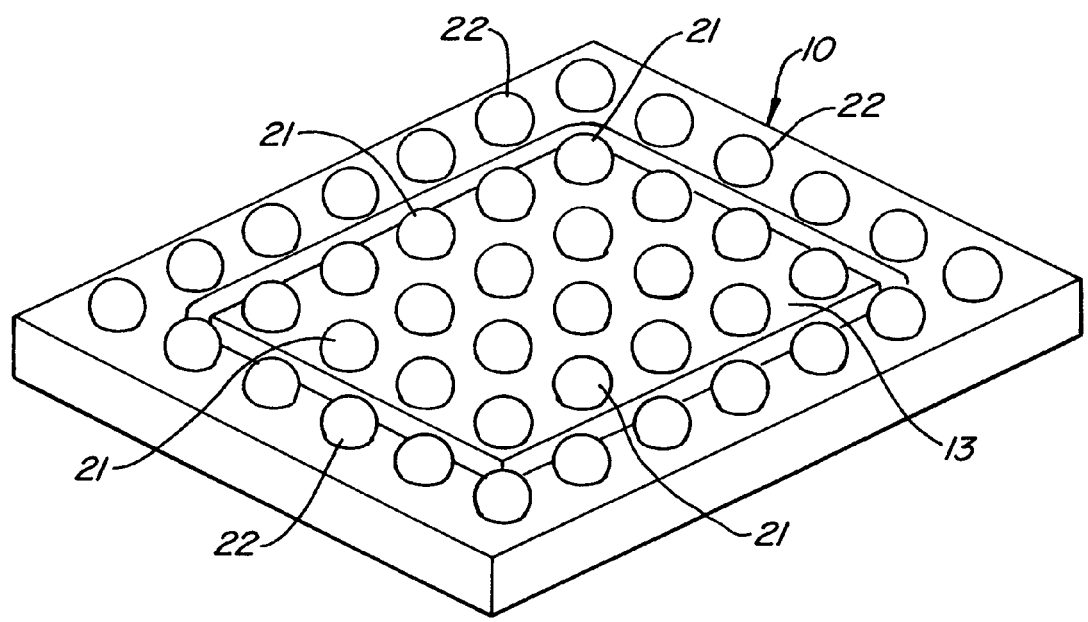
FIG. 2 is a perspective view of the flip chip leadframe illustrated in FIG. 1 including solder balls and the die.
Figure 3:
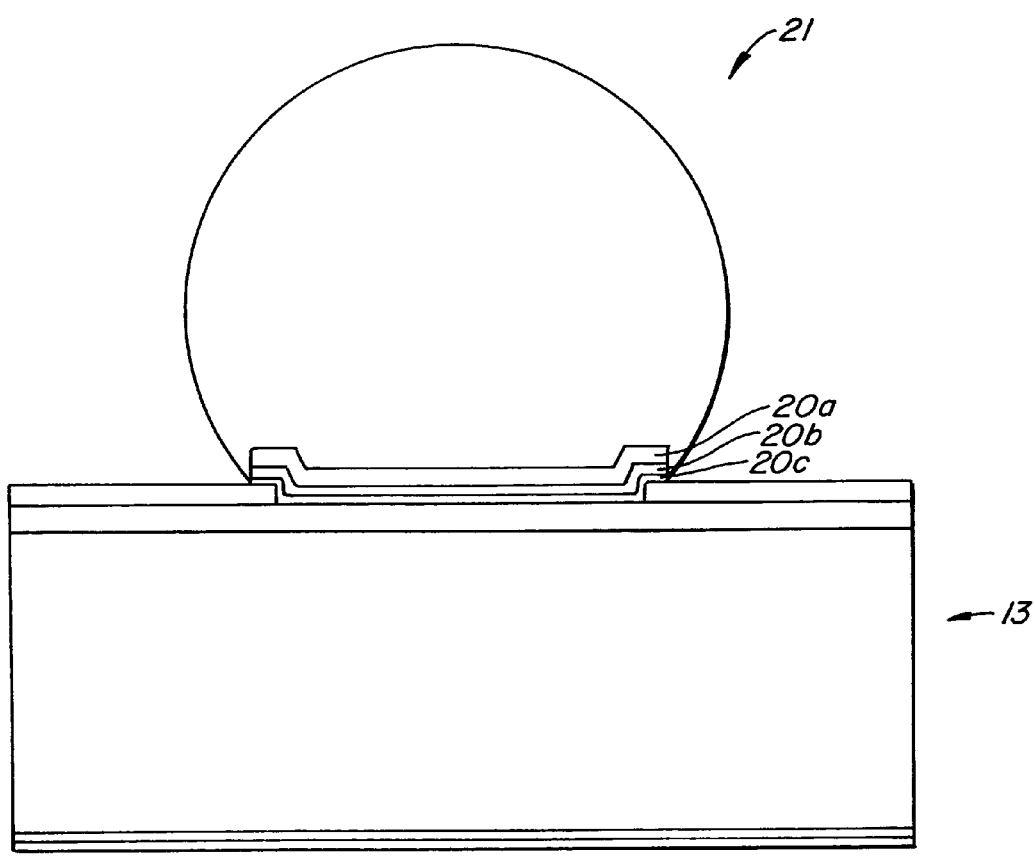
FIG. 3 is a schematic side view of a bumped die.

As can be seen in FIG. 2, a die 13 is placed within the cavity to complete the chip device. Die 13 is preferably a one-piece item that is often referred to in the art as a "bumped die." As can be seen in FIG. 3, a bumped die includes die 13, "under bump material" that serves as an intermediate layer 20 between the top surface of the die and solder bump 21, and the solder bumps themselves. Preferably, the under bump material is one of TiW, Cu, Au or an equivalent. In the example illustrated in FIG. 3, the under bump material is broken into three layers—Cu plating 20a, sputtered Cu 20b and sputtered Ti 20d.

The die attach pad area is etched out such that the depth of the cavity is the same as the die thickness. Preferably, the leadframe consists of a material made of thermally and electrically conductive metal alloy such as, for example, copper based Eftec 3S. Additionally, in a preferred embodiment, the leadframe is coated with a solderable coating such as Ni:Pd.

Solder balls 22 are placed within the dimples. These solder balls serve as the connection for the drain region of the die since the leadframe is conductive. Solder bumps 21 serve as the connections for the source and gate regions.

The reverse side of the leadframe may be marked with the product code and other manufacturing codes, either at the leadframe fabricator's end or during assembly of the IC packages.

As a result of this structure, a bumped die may be die attached into the leadframe cavity using conventional die attach processes. The solder balls on the bumped die form (both in the cavity and the dimples) the source and gate connections to the PCB with the solder balls on the leadframe forming the drain connections.

Thus, the present invention provides an improved chip device, such as a MOSFET BGA, that has improved thermal performance. The improved thermal performance is due to the fact that heat is dissipated from the face of the die (where it is generated) as well as from the bottom of the die due to its contact with the leadframe structure. Additionally, the present invention provides a chip device that results in a thinner package (generally less than 1 millimeter) comparable to TSSOP stand-off, which is the current trend for miniaturization. The manufacturing process is also simplified since solder ball attach of the leads of the leadframe have been eliminated and conventional assembly process steps, such as wire bonding, molding, forming and plating, have also been eliminated.

Although the invention has been described with reference to specific exemplary embodiments, it will appreciated that it is intended to cover all modifications and equivalents within the scope of the appended claims.

What is claimed is:

1. A method of making a chip device, the method comprising:
   providing a die having a first surface with a drain connection and a second surface opposite the first surface;
   providing a leadframe including a major surface defining at least part of a die attach cavity and a plurality of dimples defined around a periphery of the leadframe, the die attach cavity having substantially the same thickness as the die;
   placing solder in the dimples; and
   placing the die in the die attach cavity and attaching the die to the leadframe, wherein the first surface including the drain connection is electrically coupled to the major surface defining at least part of the die attach cavity and the solder in the dimples of the leadframe.

2. The method of claim 1 wherein the die is a bumped die.

3. The method of claim 1 wherein the second surface of the die includes source and gate connections and wherein the method further comprises placing solder on the source and gate connections.

4. The method of claim 1 wherein the leadframe comprises a copper based alloy.

5. The chip device of claim 1 wherein the leadframe includes a solderable coating.

6. The method of claim 1 wherein the leadframe comprises a Ni—Pd coating.

7. The method of claim 1 wherein the step of attaching the die is performed such that the die is coplanar with a top surface of the leadframe.

8. The method of claim 1 further comprising the step of adding a solderable coating to the leadframe.

9. The method of claim 1 wherein the leadframe is conductive.

10. The method of claim 9 wherein the conductive leadframe comprises a copper based alloy.

11. The method of claim 1 wherein the die comprises a MOSFET.

12. The method of claim 1 wherein the cavity has a square shape.

* * * * *